United States Patent
Burdt et al.

(10) Patent No.: US 12,169,363 B2
(45) Date of Patent: Dec. 17, 2024

(54) RADIATION SOURCE TESTING

(71) Applicant: Cymer, LLC, San Diego, CA (US)

(72) Inventors: Russell Allen Burdt, San Diego, CA (US); Thomas Patrick Duffey, San Diego, CA (US)

(73) Assignee: Cymer, LLC, San Diego, CA (US)

(*) Notice: Subject to any disclaimer, the term of this patent is extended or adjusted under 35 U.S.C. 154(b) by 303 days.

(21) Appl. No.: 17/772,207

(22) PCT Filed: Oct. 16, 2020

(86) PCT No.: PCT/US2020/055987
§ 371 (c)(1),
(2) Date: Apr. 27, 2022

(87) PCT Pub. No.: WO2021/086640
PCT Pub. Date: May 6, 2021

(65) Prior Publication Data
US 2022/0404717 A1    Dec. 22, 2022

Related U.S. Application Data

(60) Provisional application No. 62/928,254, filed on Oct. 30, 2019.

(51) Int. Cl.
G03F 7/00    (2006.01)
(52) U.S. Cl.
CPC ...... *G03F 7/70516* (2013.01); *G03F 7/70591* (2013.01)
(58) Field of Classification Search
CPC ............. G03F 7/70516; G03F 7/70591; G03F 7/7055; G03F 7/70041
See application file for complete search history.

(56) References Cited

U.S. PATENT DOCUMENTS 5,383,217 A    1/1995    Uemura
6,392,743 B1    5/2002    Zambon et al.
(Continued)

FOREIGN PATENT DOCUMENTS

EP    1521122 A1    4/2005
JP    2001358064 A    12/2001
(Continued)

OTHER PUBLICATIONS

Matthias Meixner, European International Searching Authority, International Search Report and Written Opinion, corresponding PCT Application No. PCT/US2020/055987, mailed Feb. 18, 2021, 11 pages total.
(Continued)

*Primary Examiner* — David P Porta
*Assistant Examiner* — Meenakshi S Sahu
(74) *Attorney, Agent, or Firm* — DiBerardino McGovern IP Group LLC

(57) ABSTRACT

A method of generating a test for a radiation source for a lithographic apparatus comprises a step of receiving data corresponding to a plurality of firing patterns of the radiation source. The method further comprises the step of analyzing the data to determine parameters for configuring one or more further firing patterns for testing the radiation source. The parameters are determined such that a stability of the radiation source when executing the one or more further firing patterns configured using the parameters is substantially the same as, or within predefined bounds relative to, a stability of the radiation source when executing the plurality of firing patterns. Furthermore, parameters are determined such that a total duration of the one or more further firing patterns when executed by the radiation source will be less than a duration of the plurality of firing patterns when executed by the radiation source.

30 Claims, 7 Drawing Sheets

(56) References Cited

U.S. PATENT DOCUMENTS

| | | |
|---|---|---|
| 2001/0020195 A1 | 9/2001 | Patel et al. |
| 2004/0021840 A1* | 2/2004 | Heintze ............... G03F 7/70558 |
| | | 355/30 |
| 2013/0003773 A1 | 1/2013 | O'Brien et al. |
| 2017/0179677 A1 | 6/2017 | Thornes et al. |
| 2019/0155170 A1* | 5/2019 | Aggarwal ............... H01S 3/225 |
| 2020/0067259 A1 | 2/2020 | Masuda et al. |

FOREIGN PATENT DOCUMENTS

| | | |
|---|---|---|
| JP | 2013239572 A | 11/2013 |
| TW | 200402605 A | 2/2004 |
| WO | 2018229823 A1 | 4/2020 |

OTHER PUBLICATIONS

Japan Patent Office, Office Action, counterpart Japanese Patent Application No. 2022-521166, mailed Apr. 19, 2023, 4 pages total (including English translation of 2 pages).

* cited by examiner

| Laser Number | Number of Days | Number of Substrates | # of unique substrate signatures with compression in 90% of substrates | # of unique substrate signatures without compression in 90% of substrates |
|---|---|---|---|---|
| 1 | 9 | 22,000 | 19 | 30 |
| 2 | 9 | 20,000 | 45 | 103 |
| 3 | 13 | 53,000 | 13 | 439 |
| 4 | 11 | 50,000 | 6 | 227 |
| 5 | 10 | 49,000 | 17 | 16,773 |
| 6 | 9 | 30,000 | 2 | 2 |
| 7 | 12 | 63,000 | 6 | 7 |

Fig. 7

RADIATION SOURCE TESTING

CROSS REFERENCE TO RELATED APPLICATION

This application claims priority to U.S. Application No. 62/928,254, filed Oct. 30, 2019 and titled RADIATION SOURCE TESTING, which is incorporated herein in its entirety by reference.

FIELD

The present invention relates to a method and system for generating a test for a radiation source, and an associated computer program, computer-readable medium and data processing apparatus. The radiation source may be a radiation source for a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. For example, a lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

The electromagnetic radiation may be provided by a radiation source which may, for example, be an EUV or a deep ultraviolet (DUV) radiation source. Such radiation sources are typically controlled throughout a lithography process to provide radiation with desired characteristics, thus ensuring a correct and timely dosage of radiation is provided at the substrate. An accurate and reliable radiation source is critical to the lithographic process.

In order to ensure accuracy and/or reliability and/or stability of the radiation source, it is desirable to test the radiation source at intervals. However, in a production environment, there may be limited opportunities to test the radiation source without significantly interrupting the production process.

Furthermore, it is desirable to test the radiation source with a usage profile as similar as possible to a usage profile used in a production environment. However, a usage profile used in a production environment may comprise proprietary information, and thus information relating to the usage profile may not be readily available or accessible for purposes of testing the radiation source.

This background serves to set a scene to allow a skilled reader to better appreciate the following description. Therefore, none of the above discussion should necessarily be taken as an acknowledgement that that discussion is part of the state of the art or is common general knowledge. One or more aspects/embodiments of the invention may or may not address one or more of the background issues.

It is an object of at least one embodiment of at least one aspect of the present invention to obviate or at least mitigate at least one problem in the prior art.

Furthermore, it is an object of at least one embodiment of at least one aspect of the present invention to provide a technically and commercially effective method for testing a radiation source.

SUMMARY

According to a first aspect of the present invention, there is provided a method of generating a test for a radiation source for a lithographic apparatus, the method comprising the steps of: receiving data corresponding to a plurality of firing patterns of the radiation source; and analyzing the data to determine parameters for configuring one or more further firing patterns for testing the radiation source; wherein the parameters are determined such that a stability of the radiation source when executing the one or more further firing patterns configured using the parameters is substantially the same as, or within predefined bounds relative to, a stability of the radiation source when executing the plurality of firing patterns, and a total duration of the one or more further firing patterns when executed by the radiation source will be less than a duration of the plurality of firing patterns when executed by the radiation source.

Advantageously, such a method enables testing of a radiation source with a usage profile that has substantially the same effect upon the radiation source as a usage profile used during substrate production. That is, the radiation source is tested with a usage profile that has substantially the same effect upon, for example, a stability of the radiation source, as the usage profile used during substrate production. By testing the radiation source according to such a method, and thereby stressing the radiation source in much the same way as the radiation source would be stressed during substrate production, a degree of confidence in the accuracy and/or reliability and/or stability of the radiation source can be increased.

The stability of the radiation source may be an intrinsic stability.

The stability of the radiation source may be an actively controlled stability.

The stability of the radiation source may be at least one of: a wavelength stability; a bandwidth stability; an energy stability; a temperature stability.

The predefined bounds may correspond to a defined deviation from at least one of a target wavelength and/or bandwidth and/or energy of radiation from the radiation source, and/or a target temperature of the radiation source.

The parameters may comprise at least one of: a quantity of patterns; a quantity of unique patterns; characteristics of unique patterns; a frequency of patterns; a quantity of bursts per pattern; a quantity of pulses per burst; duty-cycle information; frequency and/or amplitude and/or phase modulation information; a time stamp; radiation source identification information; beam energy profile per pattern; beam wavelength profile per pattern; beam bandwidth profile per pattern.

The parameters may be determined based on at least one of: a quantity of recurring identical firing patterns; a quantity of firing patterns with characteristics within predefined thresholds; a quantity of repeating identical or similar firing patterns; a frequency of repetition of repeating identical or similar firing patterns or sequences; an induced variation in a wavelength, bandwidth and/or energy of the radiation; an induced variation in a temperature of the radiation source.

The method may further comprise the step of configuring a program for a computer for controlling the radiation source with the parameters.

The method may further comprise the step of controlling the radiation source to execute the one or more further firing patterns.

The radiation source may be tested when the lithographic apparatus is in an offline configuration.

The data corresponding to the plurality of firing patterns of the radiation source may be generated when the radiation source is under the control of a lithographic apparatus.

All steps of the method according to the first aspect may be performed in situ within a semiconductor fabrication facility.

According to a second aspect of the present invention, there is provided a computer program, the computer program comprising instructions which, when the program is executed by a computer, cause the computer to carry out the method according to the first aspect.

The computer program may comprise instructions which, when the program is executed by a computer, cause the computer to control the radiation source to execute the one or more further firing patterns.

The computer program may comprise instructions which, when the program is executed by a computer, cause the computer to provide data corresponding to the parameters to another program.

The computer program may comprise instructions which, when the program is executed by a computer, cause the computer to generate a script corresponding to the parameters for execution by another computer.

The computer program may comprise instructions which, when the program is executed by a computer, cause the computer to generate data corresponding to the parameters for a script or program on another computer.

According to a third aspect of the present invention, there is provided a computer-readable medium having stored thereon a computer program according to the second aspect.

According to a fourth aspect of the present invention, there is provided a data processing apparatus comprising a memory and a processor adapted to perform the method according to the first aspect.

According to a fifth aspect of the present invention, there is provided a system for generating a test for a radiation source for a lithographic apparatus, the system comprising: a data storage device configured to store data corresponding to a plurality of firing patterns of the radiation source; and a processor communicably coupled to the data storage device and configured to analyze the data to determine parameters for configuring a one or more further firing patterns for testing the radiation source; wherein the parameters are determined such that a stability of the radiation source when executing the one or more further firing patterns configured using the parameters is substantially the same as, or within predefined bounds relative to, a stability of the radiation source when executing the plurality of firing patterns, and a total duration of the one or more further firing patterns when executed by the radiation source will be less than a duration of the plurality of firing patterns when executed by the radiation source.

The system may comprise the radiation source. The radiation source may be a DUV or EUV radiation source.

The system may comprise a lithographic apparatus. The lithographic apparatus may be configured to control the radiation source and/or to generate the data corresponding to the plurality of firing patterns.

The lithographic apparatus may comprise, or may be communicably coupled to, the processor such that the lithographic apparatus may be configured to control the radiation source to execute the second one or more firing patterns.

According to a sixth aspect of the present invention there is provided a method of generating a test for a radiation source for a lithographic apparatus, the method comprising: receiving first data corresponding to a first one or more firing patterns of the radiation source; analyzing the first data to identify firing patterns and/or portions of firing patterns that impact upon a stability of the radiation source within a predefined range relative to other firing patterns and/or other portions of firing patterns; and generating second data corresponding to a second one or more firing patterns of the radiation source, wherein the second data is based upon the analysis of the first data.

The method may comprise configuring a computer program with the second data to operate the radiation source with the second one or more firing patterns.

Analyzing the first data may comprise binning the first data into discrete bins, wherein the discrete bins are defined by thresholds within which a stability of the radiation source may vary by less than the predefined range Analyzing the first data may comprise identifying one or more successive portions of a firing pattern that may impact upon a stability of the radiation source within the predefined range.

The plurality of firing patterns may span a first time period. The second one or more firing patterns when executed by the radiation source may span a second time period. The first time period may be substantially greater than the second time period.

The stability of the radiation source may be an intrinsic stability and/or an actively controlled stability. The stability of the radiation source may be at least one of: a wavelength stability; a bandwidth stability; an energy stability; a temperature stability.

The first data may correspond to a usage profile of the radiation source.

The first and/or second data may comprise characteristics of one or more firing patterns, wherein the characteristics comprise at least one of: a quantity of firing patterns; a quantity of unique firing patterns; a frequency of one or more firing patterns; a quantity of bursts per firing pattern; a quantity of pulses per burst; duty-cycle information; frequency and/or amplitude and/or phase modulation information; one or more time stamps; radiation source identification information; beam energy profile per pattern; beam wavelength profile per pattern; beam bandwidth profile per pattern.

BRIEF DESCRIPTION OF THE DRAWINGS

Embodiments of the invention will now be described, by way of example only, with reference to the accompanying schematic drawings, in which:

FIG. 7 shows a table of experimental data.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm). The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
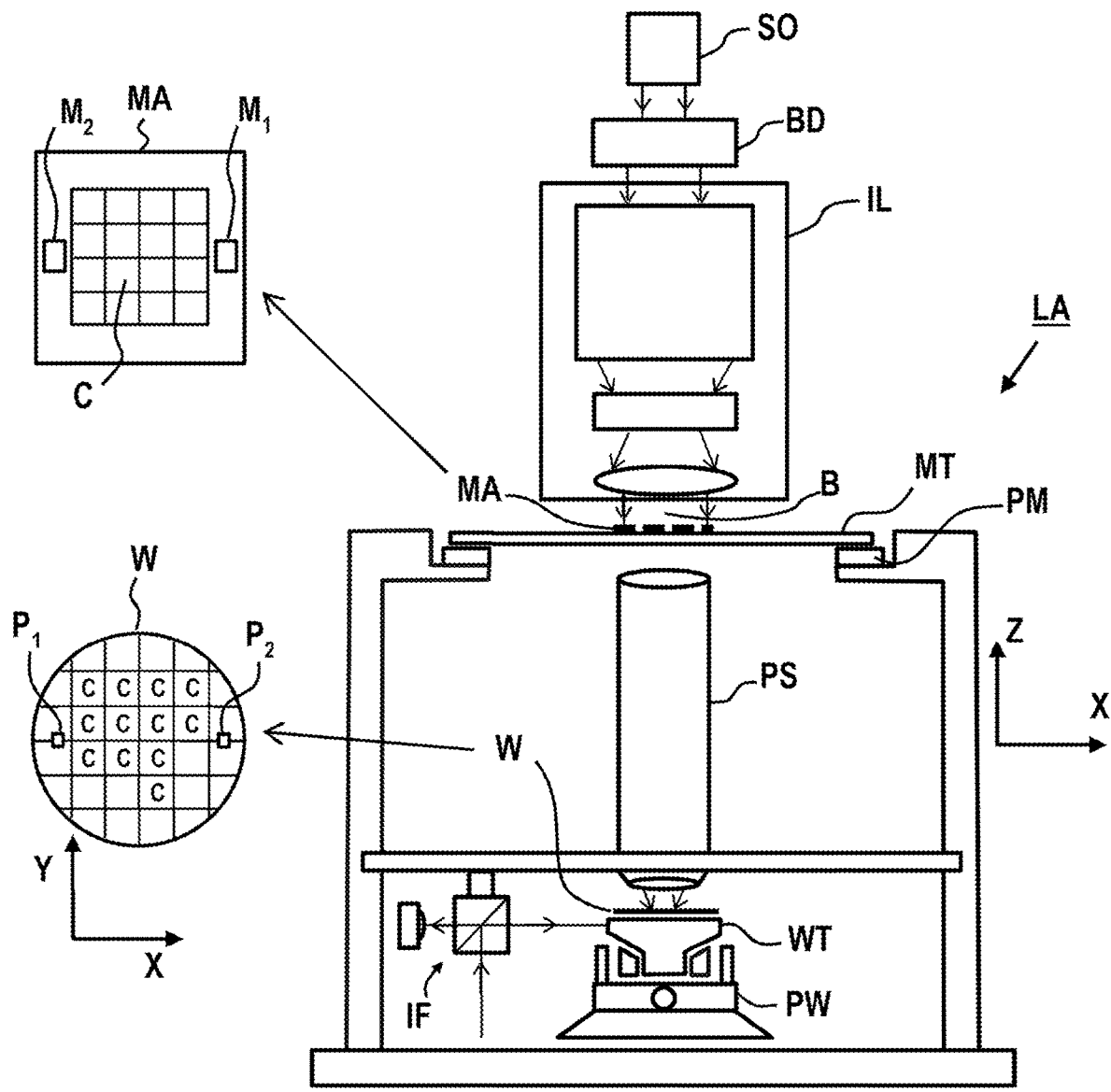
FIG. 1 depicts a lithographic system comprising a lithographic apparatus and a radiation source.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

The radiation source SO may be configured to provide the radiation beam B with predefined characteristics and timing to provide a desired radiation dosage to the substrate. As such, the radiation beam B generated by the radiation source SO is provided as one or more firing patterns, wherein the firing patterns define characteristics of the beam B.

A firing pattern is a term used in the art to describe characteristics of the beam B from the radiation source SO. For example, a firing pattern may comprise a sequence of pulses of radiation. The sequence of pulses may have, for example, specific timings and/or durations, e.g. frequencies and/or duty-cycles, to provide a required dosage to the substrate at required intervals.

The pulses of radiation may be emitted by the radiation source SO as bursts, e.g. sequences of pulses. For example, a typical burst of radiation in a semiconductor fabrication environment may comprise in the range of hundreds of pulses of radiation. Generally, but not necessarily, the pulses within a burst are periodic, e.g. each pulse within a burst has substantially the same duration and/or duty cycle, and thus delivers substantially the same amount of radiation to the substrate, as another pulse within the same burst.

A quantity of pulses in each burst may be controlled during a lithographic process. As such, a quantity of pulses in a burst may vary from a quantity of pulses in a preceding or subsequent burst.

A frequency of pulses within a burst may be represented as a burst repetition rate. For example, pulses within a burst in a semiconductor fabrication environment may have a repetition rate in a kHz range. The repetition rate of each burst may also be controlled throughout the lithographic process. As such, a frequency of pulses in a burst may vary from a frequency of pulses in a preceding or subsequent burst.

An interval between bursts, known as a burst interval or interburst interval, may be controlled during a lithographic process. An interval between bursts of pulses in a semiconductor fabrication environment may be, for example, in the millisecond to second range.

Figure 2:
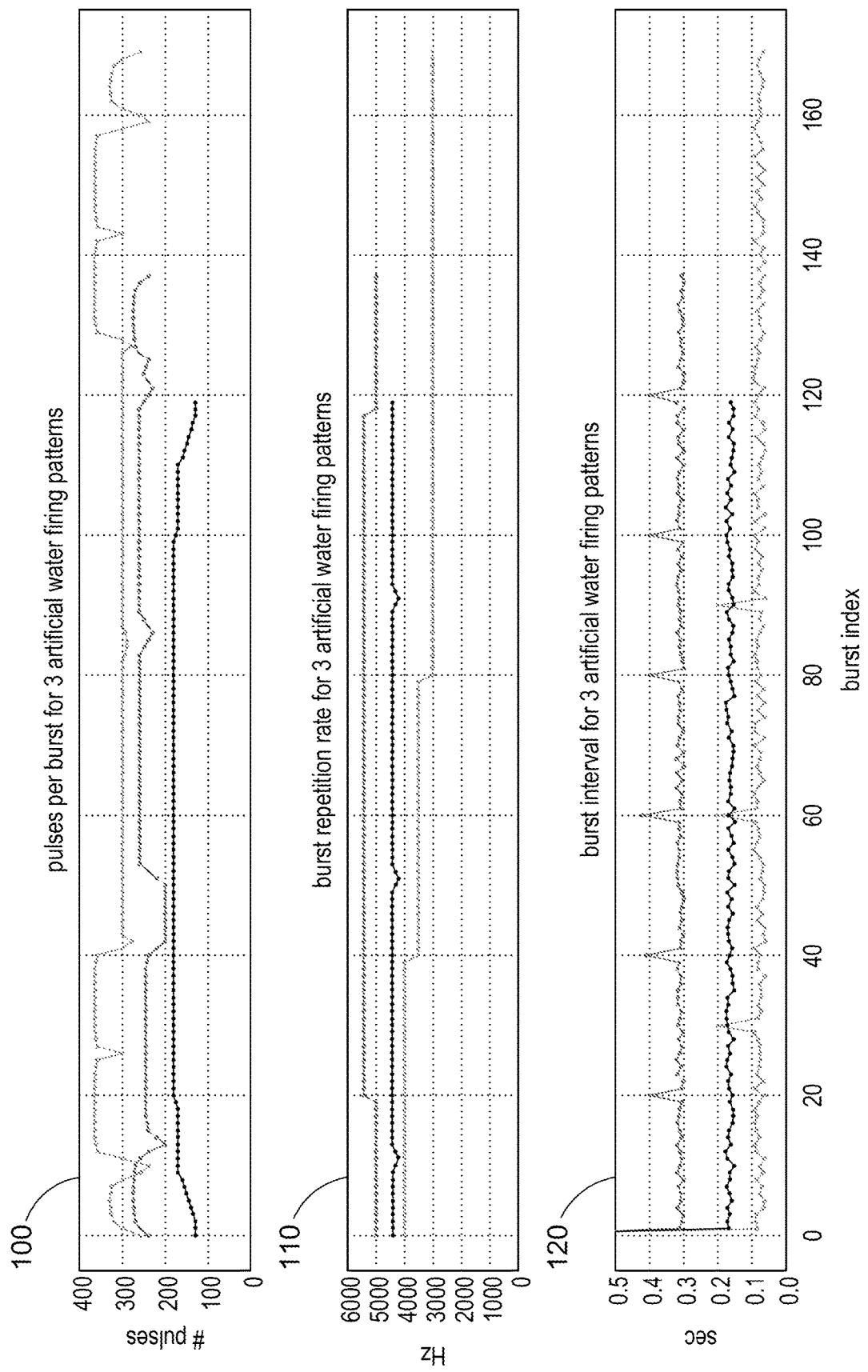
FIG. 2 provides an example of data representing radiation source firing patterns for three substrates.

For purposes of example only, FIG. 2 provides an example of data representing radiation source firing patterns for three substrates. A first graph 100 shows a quantity of pulses per burst for a firing pattern for each of three substrates. The horizontal axis represents a burst index. For example, it can be seen that a twentieth burst for a first substrate comprised approximately 180 pulses of radiation, a twentieth burst for a second substrate comprised approximately 250 pulses of radiation, and a twentieth burst for a third substrate comprised approximately 370 pulses of radiation. It will be appreciated that the firing patterns for three substrates shown in FIG. 2 may be in any chronological order. That is, data representing any of the first, second or third firing patterns may be representative of firing patterns that occur before or after any other of the first, second or third firing patterns.

A second graph 110 shows a repetition rate of the pulses in each burst of the firing patterns. For example, it can be seen that a twentieth burst for a first substrate had a repetition rate of approximately 4000 Hz, a twentieth burst for a second substrate had a repetition rate of approximately 4400 Hz, and a twentieth burst for a third substrate had a repetition rate of approximately 5400 Hz. It will be appreciated that the firing patterns for three substrates shown in FIG. 2 may be in any chronological order. That is, data representing any of the first, second or third firing patterns may be representative of firing patterns that occur before or after any other of the first, second or third firing patterns.

A third graph 120 shows a burst interval for each burst of each firing pattern. For example, a twentieth burst of the firing pattern for the first substrate had a burst interval of approximately 0.08 seconds, a twentieth burst of the firing pattern for the second substrate had a burst interval of approximately 0.16 seconds, and a twentieth burst of the firing pattern for the third substrate had a burst interval of approximately 0.40 seconds. It will be appreciated that the firing patterns for three substrates shown in FIG. 2 may be in any chronological order. That is, data representing any of the first, second or third firing patterns may be representative of firing patterns that occur before or after any other of the first, second or third firing patterns.

As such, it can be seen from the graphs 100, 110, 120 that the firing patterns for different substrates may vary in terms of their characteristics. It can also be seen that for any given substrate, characteristics of the firing pattern vary over time. That is, the burst intervals, repetition rate and pulses per burst of a firing pattern may vary over time, and/or may vary from substrate to substrate.

Such variations in the characteristics of the firing patterns may influence intrinsic dynamics of the radiation source SO and/or controller stability. That is, the radiation source SO may be required to provide radiation with defined characteristics, e.g. specified energy levels delivered at a specified frequency. Variations in the characteristics of the firing pattern may impact upon the radiation source's ability to deliver radiation that meets the target parameters.

The radiation source SO may comprise at least one, and typically a plurality of, feedback controllers that are configurable to adjust actuators within the radiation source SO and/or throughout the lithographic apparatus LA, such that radiation emitted by the radiation source SO meets the desired specification. For example, in the event that a target radiation wavelength is 193.0 nm and the radiation source SO emits radiation with a wavelength of 193.1 nm, a controller known as a wavelength controller may observe an error of 0.1 nm in the wavelength of the emitted radiation and adjust an internal component within the radiation source SO accordingly such that a subsequent pulse of radiation has a wavelength of 193.0 nm, thus meeting the target wavelength.

The radiation source SO can operate with or without the feedback controllers. Operation without the feedback controllers present or enabled is known as 'intrinsic operation'. Continuing with the above example, an energy of a series of pulses from the radiation source SO without the feedback controllers enabled and with a target of 10 mJ per pulses may be, for example, 10.4 mJ, 10.9 mJ and 9.2 mJ.

In contrast, when the feedback controllers are enabled, a performance of the radiation source SO may be stabilized, or more quickly stabilized, such that an energy of the pulses may be improved to, for example, 10.1 mJ, 10.2 mJ and 9.9 mJ. That is, a deviation from a target energy level per pulse has been reduced, or more quickly reduced.

The stability of the radiation source SO with the feedback controllers disabled is known as the intrinsic stability of the light source. Variations in an output of the radiation source, such as due to changes in the firing patterns, when the controllers are disabled is known as, or representative of, intrinsic dynamics of the radiation source SO. An intrinsic stability of the radiation source SO depends upon such intrinsic dynamics.

The stability of the radiation source SO with the feedback controllers enabled is known as a controlled stability of the radiation source SO.

Changes in the firing pattern of the radiation source SO can impact both the intrinsic stability and the controlled stability of the feedback controller(s).

In particular, the intrinsic stability is typically sensitive to changes in burst repetition rate. That is, changes in the burst repetition rate of a firing pattern may, at least temporarily, degrade an intrinsic performance of the radiation source SO, e.g. an ability of the radiation source to output radiation that meets a target specification.

Likewise, a controlled stability of the one or more feedback controllers may be particularly sensitive to changes in the firing pattern. For example, long intervals between bursts may interfere with controller functionality, thus degrading a performance of the radiation source SO, e.g. an ability of the radiation source SO to output radiation that meets a target specification.

The intrinsic and/or controlled stability of the radiation source SO can, for example, correspond to a wavelength stability, a bandwidth stability, and/or an energy stability. The intrinsic and/or controlled stability of the radiation source SO can, for example, correspond to a temperature stability of the radiation source.

In a production environment, firing patterns of the radiation source SO may be controlled by the lithographic apparatus LA. That is, the lithographic apparatus LA may communicate information and/or data and/or parameters to the radiation source SO relating to a specific firing pattern and/or a particular radiation dosage required. The radiation source SO may then be controlled and/or configured to emit a particular firing pattern in response to such information and/or data and/or parameters. As such, data corresponding to a plurality of firing patterns of the radiation source may be generated when the radiation source is under the control of the lithographic apparatus.

The specific firing pattern and/or particular radiation dosage may be related to a pattern to be applied to a substrate by the lithographic apparatus LA. Typically, such a pattern to be applied to a substrate may comprise proprietary information, e.g. information that is confidential and relating to a particular pattern to be applied to the substrate. As such, firing patterns that are generated by the radiation source SO when the radiation source SO is controlled by the lithographic apparatus LA may, indirectly, comprise proprietary information.

In a production environment, the radiation source SO may need to be intermittently tested to ensure correct and/or sufficiently accurate and/or reliable performance. It is desirable to test the radiation source SO using firing patterns that are identical to, or sufficiently similar to, firing patterns that may be used during substrate patterning such that an intrinsic and/or controlled stability of the radiation source is tested and/or stressed in substantially the same manner as during substrate patterning.

However, due to practical and commercial constraints, it may not be possible or allowable to use firing pattern data that directly or indirectly comprises proprietary information for such testing. In particular, it may not be possible or allowable to transmit firing pattern data to an entity located remotely from the production environment, e.g. to a remote server, for purposes of assessing performance of the radiation source SO, due to a proprietary nature of the firing pattern data.

Furthermore, in a production environment, the radiation source SO may be continually or intermittently in use for extended periods of time, such as weeks or months, between service intervals. It is generally impractical to collect firing pattern data over such extended periods of time and then test the radiation source using the same firing pattern data, due to a length of time that would be required to complete such tests.

Figure 3:
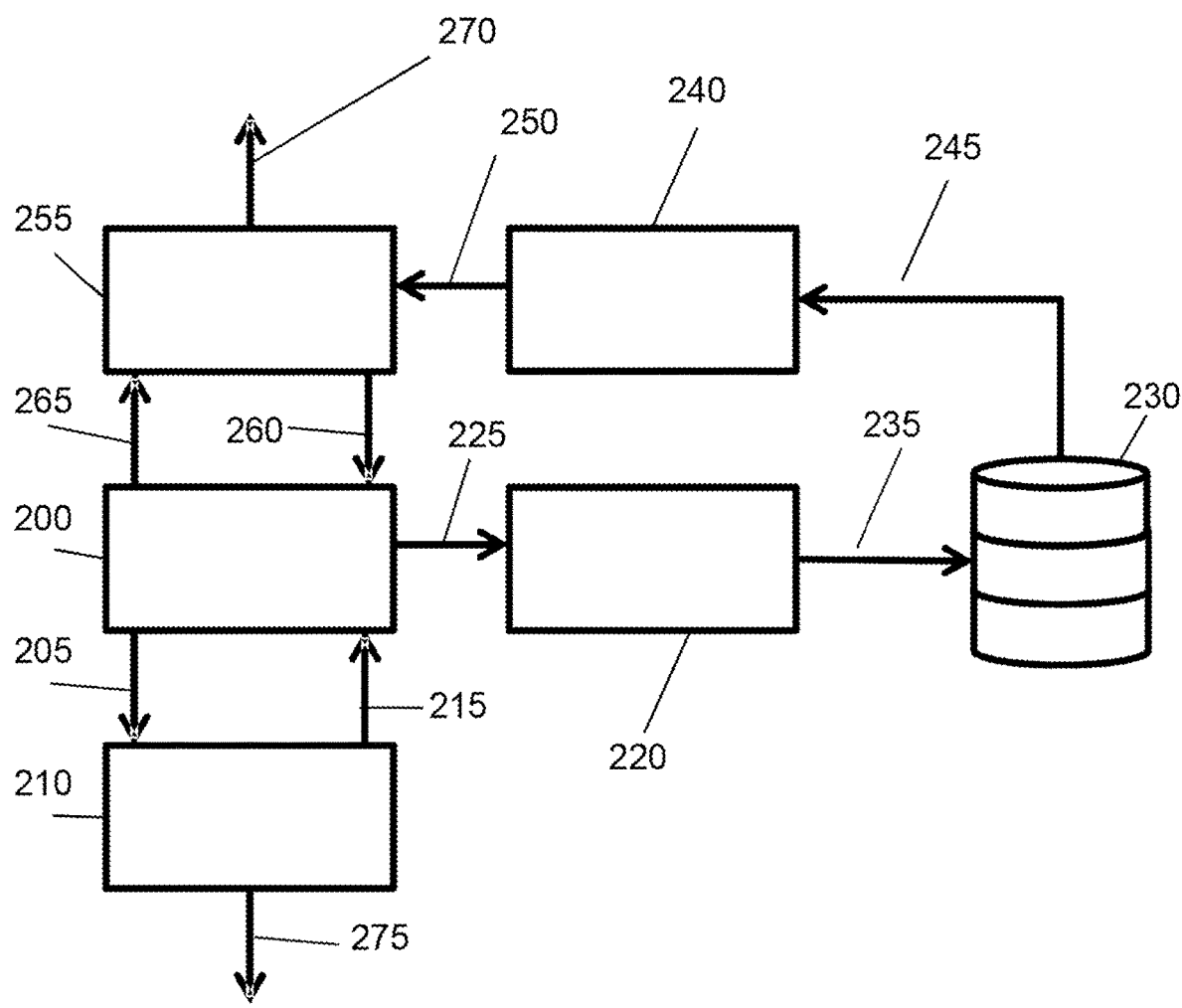
FIG. 3 shows a method of generating a test for a radiation source for a lithographic apparatus.

Referring to FIG. 3, there is shown a method of generating a test for a radiation source for a lithographic apparatus 210. FIG. 3 shows the radiation source 200. The radiation source 200 may be, for example, an EUV or DUV radiation source. The radiation source 200 provides radiation 205 in the form of a beam to a lithographic apparatus 210. The lithographic apparatus 210 may be a scanner. The lithographic apparatus 210 is configured to pattern a substrate using radiation 205 from the radiation source 200. The lithographic apparatus 210 is configurable to produce substrates 275 directly or indirectly patterned by the radiation source.

The radiation 205 is typically provided as a plurality of firing patterns. The radiation 205 may be provided as one or more firing patterns comprising, for example, a sequence of bursts of pulses with predefined and/or controlled characteristics, as exemplified in FIG. 2.

The lithographic apparatus 210 provides at least one control signal 215 to the radiation source 200. The control signal may comprise data corresponding to, for example, a radiation dosage required by the lithographic apparatus 210 for patterning a substrate. As such, the control signal 215 may be used by the radiation source 200 to directly or indirectly control and/or define firing pattern(s) of the radiation 205 emitted by the radiation source 210. In other embodiments, and/or in other modes of operation of the present embodiment, the firing patterns may be provided by the lithographic apparatus 210 to the radiation source 200. That is, rather than the radiation source 200 using a control signal 215 from the lithographic apparatus 210 to determine and/or calculate an appropriate firing pattern, the firing pattern (or information directly pertaining to the firing pattern) may be provided by the lithographic apparatus 210 to the radiation source 200. Such a firing pattern (or information directly pertaining to the firing pattern) may be calculated, determined or otherwise derived by the lithographic apparatus 210, e.g. by a processor within the lithographic apparatus 210.

In a preferred embodiment, the method comprises the use of a data collection module 220. The data collection module 220 may collect data 225 from the radiation source 200. The data 225 may correspond to the firing pattern(s) of the radiation 205 emitted by the radiation source 200. The data collection module 220 is communicably coupled to, or configurable to be communicably coupled to, the radiation source 210. The data collection module 220 may be integrated into the radiation source or the lithographic apparatus 210.

The data collection module 220 is configured to provide data 235 to a data storage device 230. The data 235 provided to the data storage device 230 corresponds to and/or is derived from the data 225 collected by the data collection module.

The data 235 provided to the data storage device 230 may be in the same or in a different format to data 225 collected by the data collection module 220. Furthermore, in other embodiments falling within the scope of the invention, the radiation source 200 may be configured or adapted to directly provide data 225 corresponding to the firing pattern(s) of the radiation 205 emitted by the radiation source 200 to the data storage device 230.

The data storage device 230 may be located within the same production environment as the lithographic apparatus 210. As such, all of the steps of the described method are performed in situ within a semiconductor fabrication facility. Advantageously, in this manner proprietary data is not required to leave the semiconductor fabrication facility during the method of generating the test for the radiation source 200.

In a preferred embodiment, the data storage device 230 is, or comprises, a server. The data storage device 230 is configured to receive data 225 from the data collection module 220 and to transmit data 245 to a data processor 240.

The data 245 transmitted to the data processor 240 corresponds to the data 225 provided to the data storage device 230. The data 245 transmitted to the data processor 240 can be in the same, or in a different format to, the data 225 provided to the data storage device 230. In other embodiments, the data collection module 220 is configurable to directly provide or transmit data to the data processor 240. In further embodiments, the radiation source is configurable to directly provide or transmit data to the data processor 240.

The data 245 transmitted to the data processor 240 from the data storage device 230 may be transmitted upon a request issued to the data storage device 230 by the data processor 240. The data storage device 230 may be configured to store data corresponding to firing pattern(s) used for patterning one or more substrates. In a preferred embodiment, the data storage device 230 is configured to store data corresponding to all, or substantially all, of the firing patterns of the radiation source that occur between service intervals of the radiation source 200 and/or service intervals of the lithographic apparatus 210. As such, in a preferred embodiment the data storage device 230 is configurable to store data corresponding to all of the firing patterns of the radiation source 200 occurring over a period generally spanning several weeks, and typically months.

In a preferred embodiment the data processor 240 is a software product, e.g. a computer program. It will be appreciated that, in other embodiments falling within the scope of the invention, the data processor 240 may be a data processing apparatus, e.g. a hardware module. Furthermore, the data processor 240 may be implemented on the data storage device 230. In yet further embodiments, the data processor 240 may be disposed within, or a computer program product residing on, the radiation source 200 itself. In yet further embodiments, the data processor 240 may be implemented on a separate computer, such as a portable computer, e.g. a service engineer's laptop computer or the like. In yet further embodiments, the data processor 240 may be implemented in the lithographic apparatus 210.

The data processor 240 is configured to analyze the data 245 to determine parameters for configuring one or more further firing patterns for testing the radiation source 200. In particular, the data processor 240 is configured to determine parameters such that a stability of the radiation source 200 when executing the one or more further firing patterns configured using the parameters is substantially the same as, or within predefined bounds relative to, a stability of the radiation source 200 when executing the plurality of firing patterns. Furthermore, a total duration of the one or more further firing patterns when executed by the radiation source 200 will be less than a duration of the plurality of firing patterns when executed by the radiation source 200. Preferably, a total duration of the one or more further firing patterns when executed by the radiation source 200 will be substantially less than a duration of the plurality of firing patterns when executed by the radiation source 200. For example, a total duration of the one or more further firing patterns when executed by the radiation source 200 may be in the region of minutes or hours. This is in comparison to a duration of the original firing patterns upon which data 245 is based, which may have a total duration in the region of weeks or even months. The stability of the radiation source 200 is an intrinsic stability and/or an actively controlled stability.

In a preferred embodiment, the data processor 240 generates a script or a software program that uses the determined parameters to generate data corresponding to the one or more further firing patterns. In one embodiment, the data processor 240 is configurable to use the determined parameters to generate a program which may, in turn, generate data corresponding to the one or more further firing patterns for testing the radiation source 200. In yet a further embodiment, the data processor 240 is configurable to provide the determined parameters to another computer, e.g. a service engineer's laptop. In such an embodiment, the other computer may comprise software adapted to generate data corresponding to the one or more further firing patterns based on received parameters. In yet a further embodiment, the data processor 240 is configurable to use the determined parameters to control, either directly or indirectly, the radiation source 200 to generate the one or more further firing patterns for testing the radiation source 200. That is, the described method comprises a step of configuring a program for a computer for controlling the radiation source with the parameters.

In a preferred embodiment, the data processor 240 is configurable to generate a script 250 or a software program that uses the determined parameters to generate data corresponding to the one or more further firing patterns, and provide the script 250 to a further processor 255, e.g. a laptop such as a field service engineer's laptop. In yet a further embodiment, the data processor 240 is a software program installed on the further processor 255, wherein the further processor 255 is configurable to directly retrieve the data 245 from the data storage device 230.

Thus, it will be appreciated that the data processor 240 may be a software program installed on a dedicated computer, data storage device 230 or a further processor 255, such as a service engineer's laptop. Furthermore, the data processor 240 may be a software program installed on the radiation source 200, e.g. installed and/or located within a computer and/or processor and/or memory of the radiation source 200.

The determined parameters comprise at least one of: a quantity of patterns; a quantity and/or characteristics of unique or substantially unique patterns; a frequency of patterns; a quantity of bursts per pattern; a quantity of pulses per burst; duty-cycle information; frequency and/or amplitude and/or phase modulation information; a time stamp; radiation source identification information; beam energy profile per pattern; beam wavelength profile per pattern; beam bandwidth profile per pattern.

In the preferred embodiment, wherein the further processor 255 is configurable to execute script 250, the further processor 255 is adapted to be coupled to the radiation source 200 in order to control or configure the radiation source 200 to generate the one or more further firing patterns.

Preferably, the further processor 255 is coupled to the radiation source at a service interval of the radiation source 200 or of the lithographic apparatus 210. As such, the further processor 255 is configurable to test the radiation source 200 when the radiation source 200 is not in use for production purposes. That is, the radiation source 200 is tested when the lithographic apparatus 210 is in an offline configuration.

Preferably, the further processor 255 is configurable to test the radiation source 200 at any time, e.g. not only at service intervals of the radiation source 200 and/or service intervals of the lithographic apparatus 210. That is, the further processor 255 may be coupled to the radiation source 200 at any time. The lithographic apparatus 210 may subsequently need to be taken offline for purposes of testing the radiation source 200.

The further processor 255 provides data 260 corresponding to the one or more further firing patterns to the radiation source 200. Alternatively, or additionally, the further processor 255 provides a script or executable program corresponding to the one or more further firing patterns to the radiation source 200.

The further processor 255 is adapted to receive data 265 from the radiation source 200. The data 265 provides information relating to results of the tests. For example, data 265 may indicate a stability and/or accuracy of the radiation source.

As such, the further processor 255 is configurable to test the radiation source 200 and to receive data 265 which may correspond to or indicate a level of accuracy and/or reliability and/or stability of the radiation source 210, e.g. a degree of success or failure of the test.

The further processor 255 is configurable to provide data 270 corresponding to the level of accuracy and/or reliability and/or stability of the radiation source 210, which may for example be in the form of a report.

The above described method may be implemented on a system for generating a test for a radiation source for a lithographic apparatus. For example, there may be provided a system comprising the data storage device 230 configured to store data corresponding to a plurality of firing patterns of the radiation source 200. The system may comprise a processor, e.g. the above described data processor 240. The processor may be communicably coupled to the data storage device 230 and configured to analyze the data to determine parameters for configuring a one or more further firing patterns for testing the radiation source. The parameters are determined such that a stability of the radiation source 200 when executing the one or more further firing patterns configured using the parameters is substantially the same as, or within predefined bounds relative to, a stability of the radiation source 200 when executing the plurality of firing patterns, and a total duration of the one or more further firing patterns when executed by the radiation source 200 will be less than a duration of the plurality of firing patterns when executed by the radiation source.

As described above, the data processor 240 is configured to analyze the data 245 to determine one or more parameters for configuring one or more further firing patterns for testing the radiation source 200. For purposes of example, the analysis of the data and determination of some of the parameters is now described with references to FIGS. 4, 5 and 6.

Figure 4:
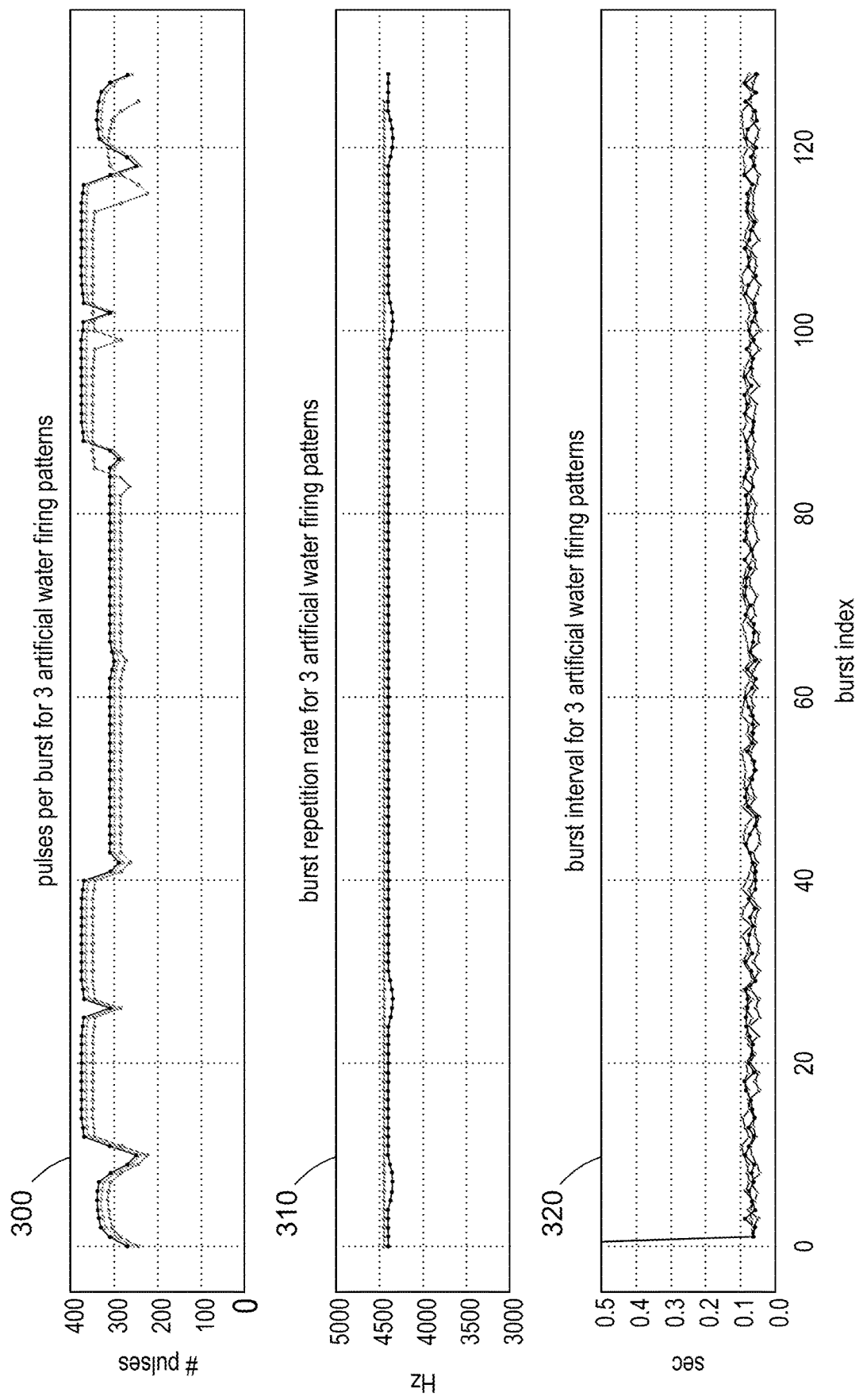
FIG. 4 provides a further example of data representing radiation source firing patterns for three substrates.

FIG. 4 provides a further example of data representing radiation source firing patterns for three substrates. The data are artificial data that may resemble production data, i.e. data taken from patterning substrates using the radiation source for production in a semiconductor fabrication facility. The graphs are comparable to those of FIG. 2. That is, a first graph 300 shows a quantity of pulses per burst for a firing pattern for each of three substrates, a second graph 310 shows a repetition rate of the pulses in each burst of the firing patterns, and a third graph 320 shows a burst interval for each burst of each firing pattern.

It can be seen in FIG. 4 that there is very little variation between the firing pattern data for each substrate. That is, the second graph 310 and third graph 320 show data for three substrates that is nearly identical. With regards to the first graph 300, a difference in the number of pulses per burst for each substrate is generally constant at approximately 50 pulses per burst.

Due to there only being slight differences between the firing pattern data for each of the three substrates, from a perspective of generating one or more further firing patterns for testing the radiation source, the three firing patterns can be considered to be substantially the same. That is, due to only slight differences between the firing pattern data for each of the three substrates, each of the firing patterns can be considered to have substantially the same impact upon the intrinsic stability and/or the actively controlled stability of the radiation source. Thus, a single firing pattern, or a 'unique firing pattern', can be identified that impacts upon the intrinsic stability and/or the actively controlled stability of the radiation source in substantially the same way as each of the three firing patterns in FIG. 4.

A threshold may be defined that limits a difference, or differences, between firing patterns that are considered to have substantially the same impact upon the intrinsic stability and/or the actively controlled stability of the radiation source. For example, in one embodiment of the invention, firing patterns that differ from one another by less than a defined and/or predetermined amount of pulses per burst may be considered to have substantially the same impact upon the intrinsic stability and/or the actively controlled stability of the radiation source, and thus can be represented by a 'unique firing pattern'.

Other thresholds may additionally or alternatively be defined relating to other parameters, such as differences between burst repetition rates and/or burst interval. That is, different firing patterns exhibiting differences between burst repetition rates and/or burst interval that are below defined thresholds may be considered to have substantially the same impact upon the intrinsic stability and/or the actively controlled stability of the radiation source, and thus can be represented by a single 'unique firing pattern'.

Such thresholds may be defined, estimated or calculated based upon, for example, known or measured characteristics of the radiation source, such as the type and/or configuration of the radiation source, experimental data, or the like. Furthermore, such thresholds may be defined, estimated, calculated or otherwise determined based upon subject-matter expertise.

Thus, an identification of unique firing patterns is, in effect, categorizing firing patterns into groups, or bins, based upon defined thresholds that limit a deviation between firing patterns within any given group or bin.

Figure 5:
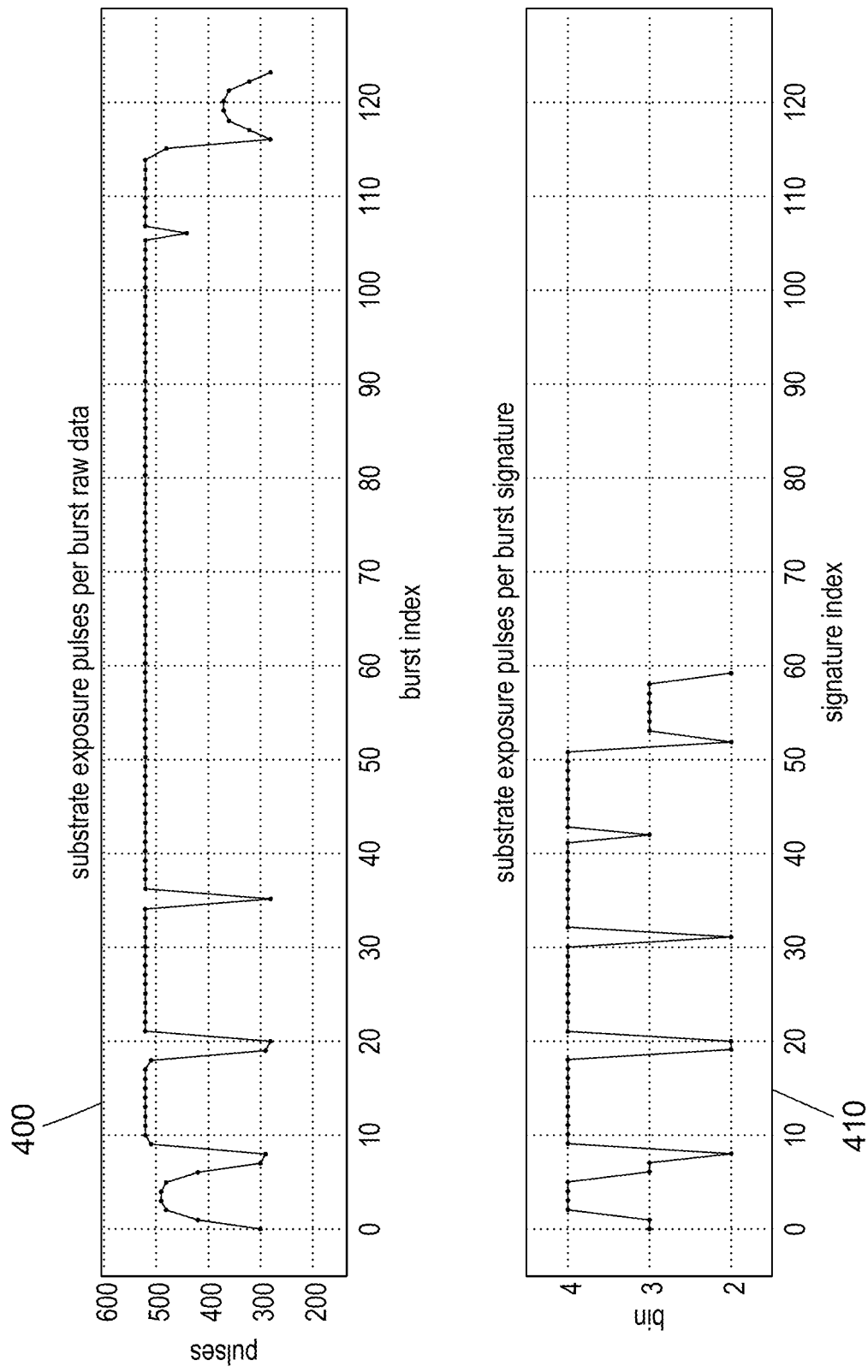
FIG. 5 shows an example of a process for deriving a signature from a firing pattern.

This is exemplified in FIG. 5, wherein a first graph 400 shows an example of a number of pulses per burst for a firing pattern. The firing pattern exhibits a number of pulses per burst ranging from approximately 300 to approximately 500 pulses per burst.

By means of example only, thresholds are defined that correspond to groups or bins of 150 pulses per burst. That is, a first bin corresponds to 0 to 149 pulses per burst. A second bin corresponds to 150 to 299 pulses per burst. A third bin corresponds to 300 to 449 pulses per burst. A fourth bin corresponds to 450 to 599 pulses per burst.

Each burst of the firing pattern falls within one of the defined groups or bins. This is shown in a second graph 410 in FIG. 5, wherein each of the bursts shown in the first graph 410 are categorized into a bin or group. For example, a tenth burst, which has approximately 520 pulses per burst, corresponds to the fourth bin or group, and a twentieth burst, which has approximately 280 pulses per burst, corresponds to the second bin or group. Thus, firing pattern data corresponding to a large range of pulses per burst can be represented by a relatively small number of bins or groups.

An intrinsic stability and/or actively controlled stability of the radiation source can be impacted by changes in firing patterns. However, firing patterns, or portions of firing patterns, that are relatively constant or vary within allowable limits, can be considered to have a limited impact to the intrinsic stability and/or actively controlled stability of the radiation source. That is, an output of the radiation source can be considered to have sufficiently stabilized after a certain amount of sequential pulses with approximately the same characteristics. Thus, when testing the radiation source by generating firing patterns that impact the intrinsic stability and/or actively controlled stability of the radiation source to the same extent as firing patterns used in a production process, it is sufficient to focus only, or predominantly, on the changes in the firing patterns.

Referring again to the first graph 400 in FIG. 5, it can be seen that a sequence of bursts extending from the thirty sixth burst to the one hundred and fifth burst each have approximately 520 pulses per burst. That is, a quantity of pulses per burst for the sequence is constant. Referring to the second graph 410 in FIG. 5, it can be seen that this sequence can be represented or approximated as 10 bursts in bin 4.

That is, in the example shown in the second graph 410 in FIG. 5, any burst sequence of 10 repeated bursts or more is limited, and thus effectively compressed, to a maximum of 10 bursts. The threshold of 10 is provided for purposes of example only, and may be varied or selected based upon a variety of factors, such as a condition in which the radiation source is operating, the type of radiation source, a configuration of the radiation source and/or an age of the radiation source.

By means of a further non-limiting example, a first firing pattern comprising 11 bursts, each operating at 300 pulses per burst, may be considered to be the same from the perspective of an impact on intrinsic stability and/or actively controlled stability of the radiation source, as a second pattern comprising 14 bursts at 290 pulses per burst. Thus, a single 'unique firing pattern' can be generated that has the same impact on intrinsic stability and/or actively controlled stability of the radiation source as the first and second firing patterns.

Thus, by compressing burst sequences based on sequences of repeating identical or similar burst patterns, and/or by grouping or binning the firing patterns, or portions of firing patterns, based on patterns that have substantially the same impact on intrinsic stability and/or actively controlled stability of the radiation source, characteristic data can be generated as shown in the second graph 410 in FIG. 5. The characteristic data can be considered to be a 'signature of the firing pattern data'. The characteristic data or signature corresponds to, or comprises, parameters that can subsequently be used to configure one or more further firing patterns for testing the radiation source.

Figure 6:
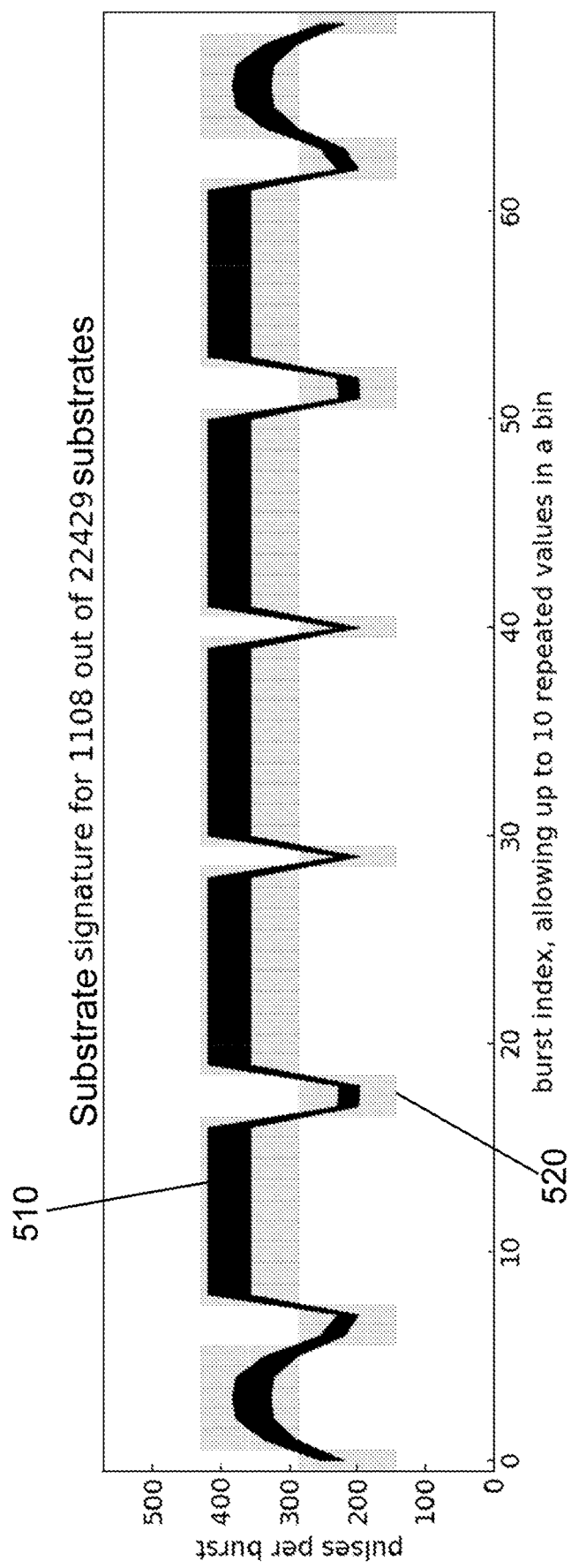
FIG. 6 shows an example of a signature derived from a plurality of similar firing patterns in a semiconductor fabrication environment.

FIG. 6 shows an example of characteristic data, or a 'signature' generated by a plurality of firing patterns in a semiconductor fabrication environment. In the example data of FIG. 6, data 510 corresponds to patterns for a total of 1108 out of 22429 substrates. Data 510 is shown as a data envelope, wherein the envelope corresponds to 1108 separate firing patterns, all of which fall within the shown envelope.

In the example of FIG. 6, any burst sequence of 10 repeated bursts or more has been limited, and thus effectively compressed, to a maximum of 10 bursts. That is, the data 510 has a maximum of 10 consecutive bursts wherein the pulse per beat of the burst falls within a defined group or bin. A group or bin has been defined as ranging from approximately 150 pulses per burst to approximately 300 pulses per burst. A further group or bin has been defined as ranging from approximately 300 pulses per burst to approximately 450 pulses per burst. It can be see that firing pattern data from firing patterns used for 1108 out of 22429 wafers fall within two defined groups or bins.

Thus, characteristic data or 'signature' 520 corresponds to, or comprises data and/or parameters that can subsequently be used to configure one or more further firing patterns for testing the radiation source, wherein a stability of the radiation source when executing the one or more further firing patterns configured using the parameters is substantially the same as, or within predefined bounds relative to, a stability of the radiation source when executing the plurality of firing patterns, and a total duration of the one or more further firing patterns when executed by the radiation source will be less than a duration of the plurality of firing patterns when executed by the radiation source. Such parameters may, for example, relate or correspond to the quantity and configuration of the groups or bins, and/or the frequency and duration that each firing pattern falls within a defined group or bin. In further embodiments, such parameters may, for example, relate or correspond to at least one of: a quantity of patterns; a quantity of unique patterns; characteristics of unique patterns; a frequency of patterns; a quantity of bursts per pattern; a quantity of pulses per burst; duty-cycle information; frequency and/or amplitude and/or phase modulation information; a time stamp; radiation source identification information; beam energy profile per pattern; beam wavelength profile per pattern; beam bandwidth profile per pattern. Furthermore, such parameters may be determined based upon at least one of: a quantity of recurring identical firing patterns; a quantity of firing patterns with characteristics within predefined thresholds; a quantity of repeating identical or similar firing patterns; a frequency of repetition of repeating identical or similar firing patterns or sequences; an induced variation in a wavelength, bandwidth and/or energy of the radiation; an induced variation in a temperature of the radiation source.

The predefined bounds correspond to a defined deviation from at least one of a target wavelength and/or bandwidth and/or energy of radiation from the radiation source, and/or a target temperature of the radiation source. That is, the one or more further firing patterns, when executed by the radiation source under test, result in an output from the radiation source that has a wavelength and/or bandwidth and/or energy that is the same, or within a defined threshold or bound relative to, a wavelength and/or bandwidth and/or energy of the plurality of firing patterns, and/or the temperature of the radiation source is the same, or within a defined threshold or bound relative to, a temperature of the radiation source when executing the plurality of firing patterns.

FIG. 7 is table of data showing a number of signatures, e.g. characteristic data as previously described with reference to FIG. 6, that have been identified for different radiation sources. For example, radiation source number 1 has been used over a period of 9 days. Over this period of 9 days, the radiation source has been used to pattern 22,000 substrates. It can be seen that 30 unique firing patterns have been used to pattern 90% of the 22,000 substrates patterned.

By analyzing the firing pattern data used, as described above with reference to FIGS. 5 and 6, it can be seen that firing patterns based on parameters of just 19 signatures are sufficient to test radiation source number 1 in a manner that will have substantially the same impact upon the intrinsic stability and/or the actively controlled stability of radiation source 1 as the original 30 unique firing patterns. This effect is described in the table of data in FIG. 7 as 'compression'.

In some instances, this effect can be more pronounced. For example, considering radiation source 5, it can be seen that over a period of 10 days, radiation source 5 has been used to pattern 49,000 substrates. It can be seen that 16,773 unique firing patterns have been used to pattern 90% of the 49,000 substrates patterned By analyzing the firing pattern data used, as described above with reference to FIGS. 5 and 6, it can be seen that firing pattern based on parameters of just 17 signatures is sufficient to test radiation source number 5 in a manner that will have substantially the same impact upon the intrinsic stability and/or the actively controlled stability of radiation source 1 as 90% of the original 16,773 unique firing patterns.

That is, the data processor 240 may be configured to analyze the data corresponding to the 16,773 unique firing patterns to determine the parameters defining the 17 signatures and thus use such parameters, as described above, to either directly or indirectly define one or more further firing patterns to test the radiation source 200, such that a stability of the radiation source 200 when executing the one or more further firing patterns configured using the parameters is substantially the same as, or within predefined bounds relative to, a stability of the radiation source 200 when executing the plurality of firing patterns. Furthermore, a total duration of the one or more further firing patterns when executed by the radiation source 200 will be less than a duration of the plurality of firing patterns when executed by the radiation source 200.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

Other aspects of the invention are set out in the following numbered clauses.

1. A method of generating a test for a radiation source for a lithographic apparatus, the method comprising the steps of:
receiving data corresponding to a plurality of firing patterns of the radiation source; and analyzing the data to determine parameters for configuring one or more further firing patterns for testing the radiation source; wherein the parameters are determined such that a stability of the radiation source when executing the one or more further firing patterns configured using the parameters is substantially the same as, or within predefined bounds relative to, a stability of the radiation source when executing the plurality of firing patterns, and a total duration of the one or more further firing patterns when executed by the radiation source will be less than a duration of the plurality of firing patterns when executed by the radiation source.

2. The method of clause 1, wherein the stability of the radiation source is an intrinsic stability.

3. The method of clause 1, wherein the stability of the radiation source is an actively controlled stability.

4. The method of clause 1, wherein the stability of the radiation source is at least one of: a wavelength stability; a bandwidth stability; an energy stability; a temperature stability.

5. The method of clause 1, wherein the predefined bounds correspond to a defined deviation from at least one of a target wavelength and/or bandwidth and/or energy of radiation from the radiation source, and/or a target temperature of the radiation source.

6. The method of clause 1, wherein the parameters comprise at least one of: a quantity of patterns; a quantity of unique patterns; characteristics of unique patterns; a frequency of patterns; a quantity of bursts per pattern; a quantity of pulses per burst; duty-cycle information; frequency and/or amplitude and/or phase modulation information; a time stamp; radiation source identification information; beam energy profile per pattern; beam wavelength profile per pattern; beam bandwidth profile per pattern.

7. The method of clause 1, wherein the parameters are determined based on at least one of:
a quantity of recurring identical firing patterns; a quantity of firing patterns with characteristics within predefined thresholds; a quantity of repeating identical or similar firing patterns; a frequency of repetition of repeating identical or similar firing patterns or
sequences; an induced variation in a wavelength, bandwidth and/or energy of the radiation; an induced variation in a temperature of the radiation source.

8. The method of clause 1, further comprising the step of configuring a program for a computer for controlling the radiation source with the parameters.

9. The method of clause 1, further comprising the step of controlling the radiation source to execute the one or more further firing patterns.

10. The method of clause 9, wherein the radiation source is tested when the lithographic apparatus is in an offline configuration.

11. The method of clause 1, wherein the data corresponding to the plurality of firing patterns of the radiation source is generated when the radiation source is under the control of a lithographic apparatus.

12. The method of clause 1, wherein all steps of the method are performed in situ within a semiconductor fabrication facility.

13. A computer-readable non-transitory medium having stored thereon instructions, which, when executed by a computer, cause the computer to carry out a method of generating a test for a radiation source for a lithographic apparatus, the method comprising the steps of:
receiving data corresponding to a plurality of firing patterns of the radiation source; and analyzing the data to determine parameters for configuring one or more further firing patterns for testing the radiation source,
wherein the parameters are determined such that a stability of the radiation source when executing the one or more further firing patterns configured using the parameters is substantially the same as, or within predefined bounds relative to, a stability of the radiation source when executing the plurality of firing patterns, and
a total duration of the one or more further firing patterns when executed by the radiation source will be less than a duration of the plurality of firing patterns when executed by the radiation source.

14. A data processing apparatus comprising a memory and a processor adapted to perform the steps of the method of clause 1.

15. A system for generating a test for a radiation source for a lithographic apparatus, the system comprising:
a data storage device configured to store data corresponding to a plurality of firing patterns of the radiation source; and
a processor communicably coupled to the data storage device and configured to analyze the data to determine parameters for configuring a one or more further firing patterns for testing the radiation source;
wherein the parameters are determined such that a stability of the radiation source when executing the one or more further firing patterns configured using the parameters is substantially the same as, or within predefined bounds relative to, a stability of the radiation source when executing the plurality of firing patterns,
and a total duration of the one or more further firing patterns when executed by the radiation source will be less than a duration of the plurality of firing patterns when executed by the radiation source.

16. The system according to clause 15, further comprising the radiation source, wherein the radiation source is a DUV radiation source.

17. The system according to clause 15, further comprising the lithographic apparatus, wherein the lithographic apparatus is configured to control the radiation source and to generate the data corresponding to the plurality of firing patterns.

18. The system according to clause 17, wherein the lithographic apparatus comprises, or is communicably coupled to, the processor such that the lithographic apparatus is configured to control the radiation source to execute the second one or more firing patterns.

19. A method of generating a test for a radiation source for a lithographic apparatus, the method comprising:
receiving first data corresponding to a first one or more firing patterns of the radiation source; analyzing the first data to identify firing patterns and/or portions of firing patterns that impact upon a stability of the radiation source within a predefined range relative to other firing patterns and/or other portions of firing patterns; and
generating second data corresponding to a second one or more firing patterns of the radiation source, wherein the second data is based upon the analysis of the first data.

20. The method of clause 19, further comprising configuring a computer program with the second data to operate the radiation source with the second one or more firing patterns.

21. The method of clause 19, wherein the analyzing the first data comprises binning the first data into discrete bins, wherein the discrete bins are defined by thresholds within which a stability of the radiation source varies by less than the predefined range.

22. The method of clause 19, wherein the analyzing the first data comprises identifying one or more successive portions of a firing pattern that impact upon a stability of the radiation source within the predefined range.

23. The method of clause 19, wherein the first one or more firing patterns when executed by the radiation source, span a first time period, and the second one or more firing patterns when executed by the radiation source, span a second time period, and wherein the first time period is substantially greater than the second time period.

24. The method of clause 19, wherein the stability of the radiation source is an intrinsic stability and/or an actively controlled stability.

25. The method of clause 19, wherein the stability of the radiation source is at least one of: a wavelength stability; a bandwidth stability; an energy stability; a temperature stability.

26. The method of clause 19, wherein the first data corresponds to a usage profile of the radiation source.

27. The method of clause 19, wherein the first and/or second data comprise characteristics of one or more firing patterns, wherein the characteristics comprise at least one of:
a quantity of firing patterns;
a quantity of unique firing patterns;
a frequency of one or more firing patterns;
a quantity of bursts per firing pattern;
a quantity of pulses per burst;
duty-cycle information;
frequency and/or amplitude and/or phase modulation information;
one or more time stamps;
radiation source identification information;
beam energy profile per pattern;
beam wavelength profile per pattern;
beam bandwidth profile per pattern.

28. A method comprising:
receiving input firing patterns, wherein the input firing patterns comprise firing patterns used by a lithographic light source during operation of the lithographic light source;
detecting recurring similar portions of the input firing patterns;
generating configurations for one or more test firing patterns, wherein each of the test firing patterns is representative of a plurality of the recurring similar portions of the input firing patterns; and
storing the configurations for the test firing patterns in a memory.

29. The method of clause 28, wherein:
the test firing patterns are firing patterns for which a stability of the lithographic light source when executing the test firing patterns is substantially the same as, or within predefined bounds relative to, a stability of the lithographic light source when executing the recurring similar portions of the input firing patterns.

30. The method of clause 28, further comprising:
providing the test firing patterns to the radiation source during a test procedure for the radiation source.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method of generating a test for a radiation source for a lithographic apparatus, the method comprising the steps of:
  receiving data corresponding to a plurality of firing patterns of the radiation source; and
  analyzing the data to determine parameters for configuring one or more further firing patterns for testing the radiation source;
  wherein the parameters are determined such that a stability of the radiation source when executing the one or more further firing patterns configured using the parameters is substantially the same as, or within predefined bounds relative to, a stability of the radiation source when executing the plurality of firing patterns,
  and a total duration of the one or more further firing patterns when executed by the radiation source will be less than a duration of the plurality of firing patterns when executed by the radiation source.

2. The method of claim 1, wherein the stability of the radiation source is an intrinsic stability.

3. The method of claim 1, wherein the stability of the radiation source is an actively controlled stability.

4. The method of claim 1, wherein the stability of the radiation source is at least one of: a wavelength stability; a bandwidth stability; an energy stability; a temperature stability.

5. The method of claim 1, wherein the predefined bounds correspond to a defined deviation from at least one of a target wavelength and/or bandwidth and/or energy of radiation from the radiation source, and/or a target temperature of the radiation source.

6. The method of claim 1, wherein the parameters comprise at least one of: a quantity of patterns; a quantity of unique patterns; characteristics of unique patterns; a frequency of patterns; a quantity of bursts per pattern; a quantity of pulses per burst; duty-cycle information; frequency and/or amplitude and/or phase modulation information; a time stamp; radiation source identification information; beam energy profile per pattern; beam wavelength profile per pattern; beam bandwidth profile per pattern.

7. The method of claim 1, wherein the parameters are determined based on at least one of:
  a quantity of recurring identical firing patterns; a quantity of firing patterns with characteristics within predefined thresholds; a quantity of repeating identical or similar firing patterns; a frequency of repetition of repeating identical or similar firing patterns or sequences; an induced variation in a wavelength, bandwidth and/or energy of the radiation; an induced variation in a temperature of the radiation source.

8. The method of claim 1, further comprising the step of configuring a program for a computer for controlling the radiation source with the parameters.

9. The method of claim 1, further comprising the step of controlling the radiation source to execute the one or more further firing patterns.

10. The method of claim 9, wherein the radiation source is tested when the lithographic apparatus is in an offline configuration.

11. The method of claim 1, wherein the data corresponding to the plurality of firing patterns of the radiation source is generated when the radiation source is under the control of a lithographic apparatus.

12. The method of claim 1, wherein all steps of the method are performed in situ within a semiconductor fabrication facility.

13. A computer-readable non-transitory medium having stored thereon instructions, which, when executed by a computer, cause the computer to carry out a method of generating a test for a radiation source for a lithographic apparatus, the method comprising the steps of:
  receiving data corresponding to a plurality of firing patterns of the radiation source; and
  analyzing the data to determine parameters for configuring one or more further firing patterns for testing the radiation source,
  wherein the parameters are determined such that a stability of the radiation source when executing the one or more further firing patterns configured using the parameters is substantially the same as, or within predefined bounds relative to, a stability of the radiation source when executing the plurality of firing patterns, and
  a total duration of the one or more further firing patterns when executed by the radiation source will be less than a duration of the plurality of firing patterns when executed by the radiation source.

14. A data processing apparatus comprising a memory and a processor adapted to perform the steps of the method of claim 1.

15. A system for generating a test for a radiation source for a lithographic apparatus, the system comprising:
  a data storage device configured to store data corresponding to a plurality of firing patterns of the radiation source; and
  a processor communicably coupled to the data storage device and configured to analyze the data to determine parameters for configuring a one or more further firing patterns for testing the radiation source;
  wherein the parameters are determined such that a stability of the radiation source when executing the one or more further firing patterns configured using the parameters is substantially the same as, or within predefined bounds relative to, a stability of the radiation source when executing the plurality of firing patterns,
  and a total duration of the one or more further firing patterns when executed by the radiation source will be less than a duration of the plurality of firing patterns when executed by the radiation source.

16. The system according to claim 15, further comprising the radiation source, wherein the radiation source is a DUV radiation source.

17. The system according to claim 15, further comprising the lithographic apparatus, wherein the lithographic apparatus is configured to control the radiation source and to generate the data corresponding to the plurality of firing patterns.

18. The system according to claim 17, wherein the lithographic apparatus comprises, or is communicably coupled to, the processor such that the lithographic apparatus is configured to control the radiation source to execute the second one or more firing patterns.

19. A method of generating a test for a radiation source for a lithographic apparatus, the method comprising:
  receiving first data corresponding to a first one or more firing patterns of the radiation source;
  analyzing the first data to identify firing patterns and/or portions of firing patterns that impact upon a stability of the radiation source within a predefined range relative to other firing patterns and/or other portions of firing patterns; and generating second data corresponding to a second one or more firing patterns of the radiation source, wherein the second data is based upon the analysis of the first data.

20. The method of claim 19, further comprising configuring a computer program with the second data to operate the radiation source with the second one or more firing patterns.

21. The method of claim 19, wherein the analyzing the first data comprises binning the first data into discrete bins, wherein the discrete bins are defined by thresholds within which a stability of the radiation source varies by less than the predefined range.

22. The method of claim 19, wherein the analyzing the first data comprises identifying one or more successive portions of a firing pattern that impact upon a stability of the radiation source within the predefined range.

23. The method of claim 19, wherein the first one or more firing patterns when executed by the radiation source, span a first time period, and the second one or more firing patterns when executed by the radiation source, span a second time period, and wherein the first time period is substantially greater than the second time period.

24. The method of claim 19, wherein the stability of the radiation source is an intrinsic stability and/or an actively controlled stability.

25. The method of claim 19, wherein the stability of the radiation source is at least one of: a wavelength stability; a bandwidth stability; an energy stability; a temperature stability.

26. The method of claim 19, wherein the first data corresponds to a usage profile of the radiation source.

27. The method of claim 19, wherein the first and/or second data comprise characteristics of one or more firing patterns, wherein the characteristics comprise at least one of:
 a quantity of firing patterns;
 a quantity of unique firing patterns;
 a frequency of one or more firing patterns;
 a quantity of bursts per firing pattern;
 a quantity of pulses per burst;
 duty-cycle information;
 frequency and/or amplitude and/or phase modulation information;
 one or more time stamps;
 radiation source identification information;
 beam energy profile per pattern;
 beam wavelength profile per pattern;
 beam bandwidth profile per pattern.

28. A method comprising:
 receiving input firing patterns, wherein the input firing patterns comprise firing patterns used by a lithographic light source during operation of the lithographic light source;
 detecting recurring similar portions of the input firing patterns;
 generating configurations for one or more test firing patterns, wherein each of the test firing patterns is representative of a plurality of the recurring similar portions of the input firing patterns; and
 storing the configurations for the test firing patterns in a memory.

29. The method of claim 28, wherein:
 the test firing patterns are firing patterns for which a stability of the lithographic light source when executing the test firing patterns is substantially the same as, or within predefined bounds relative to, a stability of the lithographic light source when executing the recurring similar portions of the input firing patterns.

30. The method of claim 28, further comprising:
 providing the test firing patterns to the radiation source during a test procedure for the radiation source.

* * * * *